United States Patent
Sun et al.

(10) Patent No.: US 10,475,826 B2
(45) Date of Patent: Nov. 12, 2019

(54) THIN FILM TRANSISTOR AND PHOTOELECTRIC DEVICE THEREOF

(71) Applicant: AU OPTRONICS CORPORATION, Hsin-chu (TW)

(72) Inventors: Shuo-Yang Sun, Hsin-chu (TW); Yu-Hsing Liang, Hsin-chu (TW); Wan-Chen Huang, Hsin-chu (TW); Chun-Cheng Cheng, Hsin-chu (TW)

(73) Assignee: AU OPTRONICS CORPORATION, Hsin-Chu (TW)

( * ) Notice: Subject to any disclaimer, the term of this patent is extended or adjusted under 35 U.S.C. 154(b) by 0 days.

(21) Appl. No.: 15/971,086

(22) Filed: May 4, 2018

(65) Prior Publication Data
US 2018/0331130 A1    Nov. 15, 2018

(30) Foreign Application Priority Data
May 9, 2017    (TW) .............................. 106115381 A

(51) Int. Cl.
*H01L 27/00*    (2006.01)
*H01L 29/00*    (2006.01)
(Continued)

(52) U.S. Cl.
CPC ...... *H01L 27/1262* (2013.01); *H01L 27/1248* (2013.01); *H01L 27/1288* (2013.01);
(Continued)

(58) Field of Classification Search
CPC ........... H01L 29/42384; H01L 29/4908; H01L 29/7869; H01L 29/66795; H01L 29/785;
(Continued)

(56) References Cited

U.S. PATENT DOCUMENTS

| 7,390,694 B2* | 6/2008 | Yamamoto | H01L 51/0012 257/E51.006 |
| 7,682,883 B2* | 3/2010 | Cho | G02F 1/13318 438/149 |

(Continued)

FOREIGN PATENT DOCUMENTS

| CN | 1581423 A | 2/2005 |
| CN | 104009043 A | 8/2014 |

(Continued)

OTHER PUBLICATIONS

Office Action issued by (TIPO) Intellectual Property Office, Ministry of Economic Affairs, R. O. C. dated Feb. 7, 2018 for Application No. 106115381, Taiwan.

(Continued)

*Primary Examiner* — Nikolay K Yushin
(74) *Attorney, Agent, or Firm* — Tim Tingkang Xia, Esq.; Locke Lord LLP

(57) ABSTRACT

A thin film transistor includes a gate electrode, a semiconductor layer, a gate dielectric layer, a first dielectric layer, a source electrode, and a drain electrode. The gate electrode is disposed on a substrate. The semiconductor layer is disposed on the substrate and overlaps with the gate electrode. The gate dielectric layer is disposed between the gate electrode and the semiconductor layer. The first dielectric layer is disposed on the substrate and covers two sides of the gate electrode or the semiconductor layer. The dielectric constant of the first dielectric layer is less than the dielectric constant of the gate dielectric layer, and the dielectric constant of the first dielectric layer is less than 4. The source electrode and the drain electrode are disposed on the substrate. The source electrode is separated from the drain electrode, and the source electrode and the drain electrode separately contact the semiconductor layer.

14 Claims, 11 Drawing Sheets

(51) Int. Cl.
*H01L 27/12* (2006.01)
*G02F 1/1368* (2006.01)
*H01L 27/144* (2006.01)
*H01L 27/32* (2006.01)

(52) U.S. Cl.
CPC ........ *G02F 1/1368* (2013.01); *H01L 27/1218* (2013.01); *H01L 27/1443* (2013.01); *H01L 27/3244* (2013.01)

(58) Field of Classification Search
CPC ........... H01L 29/42376; H01L 27/1288; H01L 27/1248; H01L 27/1262; H01L 27/3262; H01L 27/1218; H01L 27/3244; H01L 27/1443; Y02E 10/50; G02F 1/1368
See application file for complete search history.

(56) References Cited

U.S. PATENT DOCUMENTS

| 7,939,828 | B2 | 5/2011 | Chen | |
|---|---|---|---|---|
| 8,378,423 | B2* | 2/2013 | Liang | H01L 29/42384 257/365 |
| 2006/0091395 | A1 | 5/2006 | Lee et al. | |
| 2006/0208266 | A1* | 9/2006 | Yamamoto | H01L 51/0012 257/88 |
| 2009/0286336 | A1* | 11/2009 | Cho | G02F 1/13318 438/24 |
| 2015/0069336 | A1 | 3/2015 | Okumura et al. | |
| 2015/0364499 | A1 | 12/2015 | Lin et al. | |

FOREIGN PATENT DOCUMENTS

| TW | 201202274 A | 1/2012 |
|---|---|---|
| WO | 2016073478 A1 | 5/2016 |

OTHER PUBLICATIONS

Office Action issued by the State Intellectual Property Office of the Peoples Republic of China dated Jul. 3, 2019 for Application No. CN201710586035.1.

* cited by examiner

THIN FILM TRANSISTOR AND PHOTOELECTRIC DEVICE THEREOF

CROSS-REFERENCE TO RELATED PATENT APPLICATION

This non-provisional application claims priority to and the benefit of, pursuant to 35 U.S.C. § 119(a), patent application Ser. No. 106115381 filed in Taiwan on May 9, 2017. The disclosure of the above application is incorporated herein in its entirety by reference.

Some references, which may include patents, patent applications and various publications, are cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference were individually incorporated by reference.

FIELD

The present disclosure relates to the photoelectric field, and in particular, to a thin film transistor and a photoelectric device thereof.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

With the development of 3C products, for aesthetic appearance, designs of curved-surface, foldable, and furlable 3C products are challenges in current industrial designs. To implement the designs, all electronic elements disposed in the 3C products need to be flexible.

Compared with inorganic materials, organic materials have relatively good flexibility. Therefore, it is a common practice to dispose an organic material in an electronic element fully instead of an inorganic material. Although such a method can improve the overall flexibility, it may cause other problems such as shortened service life of elements.

SUMMARY

One of the embodiments disclosed in this application relates to a thin film transistor. The thin film transistor includes a gate electrode, a semiconductor layer, a gate dielectric layer, a first dielectric layer, a source electrode, and a drain electrode. The gate electrode is disposed on a substrate. The semiconductor layer is disposed on the substrate, and the semiconductor layer overlaps with the gate electrode. The gate dielectric layer is disposed between the gate electrode and the semiconductor layer, and a vertical projection scope of the gate dielectric layer on the substrate is substantially the same as a vertical projection scope of the semiconductor layer on the substrate. The first dielectric layer is disposed on the substrate, where the first dielectric layer covers two sides of the gate electrode or the semiconductor layer, a dielectric constant of the first dielectric layer is less than a dielectric constant of the gate dielectric layer, and the dielectric constant of the first dielectric layer is less than 4 and greater than 0. The source electrode and the drain electrode are disposed on the substrate, where the source electrode is separated from the drain electrode, and the source electrode and the drain electrode separately contact the semiconductor layer.

In some embodiments, the semiconductor layer is disposed below the gate electrode.

In some embodiments, the first dielectric layer covers at least one part of sides of the gate electrode and sides of the gate dielectric layer.

In some embodiments, the thin film transistor further includes an etch stop layer, disposed on the semiconductor layer.

In some embodiments, the first dielectric layer and the etch stop layer are formed of a same layer.

In some embodiments, the semiconductor layer is disposed on the source electrode, the drain electrode, and the gate dielectric layer.

In some embodiments, the gate electrode is disposed on the semiconductor layer, and the semiconductor layer is disposed on the source electrode and the drain electrode.

In some embodiments, the thin film transistor further includes a protective layer disposed on the first dielectric layer, the gate electrode is disposed on the semiconductor layer, and the source electrode and the drain electrode respectively penetrate through the gate dielectric layer and the protective layer.

In some embodiments, the first dielectric layer further includes at least one material of polyimide, poly (4-vinyl phenyl), poly (vinyl alcohol), poly (methyl methacrylate), polypropylene, a silsesquioxane polymer, a ferroelectric polymer, or benzocyclobutene.

Another aspect disclosed in this application relates to a photoelectric device. The photoelectric device includes a thin film transistor, a protective layer, and an optical element. The thin film transistor includes a gate electrode, a semiconductor layer, a gate dielectric layer, a first dielectric layer, a source electrode, and a drain electrode. The gate electrode is disposed on a substrate. The semiconductor layer is disposed on the substrate, and the semiconductor layer overlaps with the gate electrode. The gate dielectric layer is disposed between the gate electrode and the semiconductor layer, and a vertical projection area of the gate dielectric layer on the substrate is substantially the same as a vertical projection area of the semiconductor layer on the substrate. The first dielectric layer is disposed on the substrate, where the first dielectric layer covers two sides of the gate electrode or the semiconductor layer, the dielectric constant of the first dielectric layer is less than the dielectric constant of the gate dielectric layer, and the dielectric constant of the first dielectric layer is less than 4 and greater than 0. The source electrode and the drain electrode are disposed on the substrate, where the source electrode is separated from the drain electrode, and the source electrode and the drain electrode separately contact the semiconductor layer. The protective layer covers the thin film transistor and the first dielectric layer. The optical element is disposed on the substrate, and the optical element includes a first electrode, a second electrode, and an optical layer, where the optical layer is located between the first electrode and the second electrode, and one of the first electrode or the second electrode is electrically connected to the drain electrode.

In some embodiments, the optical layer includes at least one of a self-illumination layer, a non-self-illumination layer, a sensing layer, or an optical sensing layer.

In some embodiments, one of the first electrode or the second electrode that is electrically connected to the drain is used as a pixel electrode, and a vertical projection of the pixel electrode on the substrate at least partially overlaps with a vertical projection of the first dielectric layer on the substrate.

These and other aspects of the present disclosure will become apparent from the following description of the preferred embodiment taken in conjunction with the following drawings, although variations and modifications therein may be effected without departing from the spirit and scope of the novel concepts of the disclosure.

BRIEF DESCRIPTION OF THE DRAWINGS

The accompanying drawings illustrate one or more embodiments of the disclosure and together with the written description, serve to explain the principles of the disclosure. Wherever possible, the same reference numbers are used throughout the drawings to refer to the same or like elements of an embodiment, and wherein.

DETAILED DESCRIPTION

Figure 1:
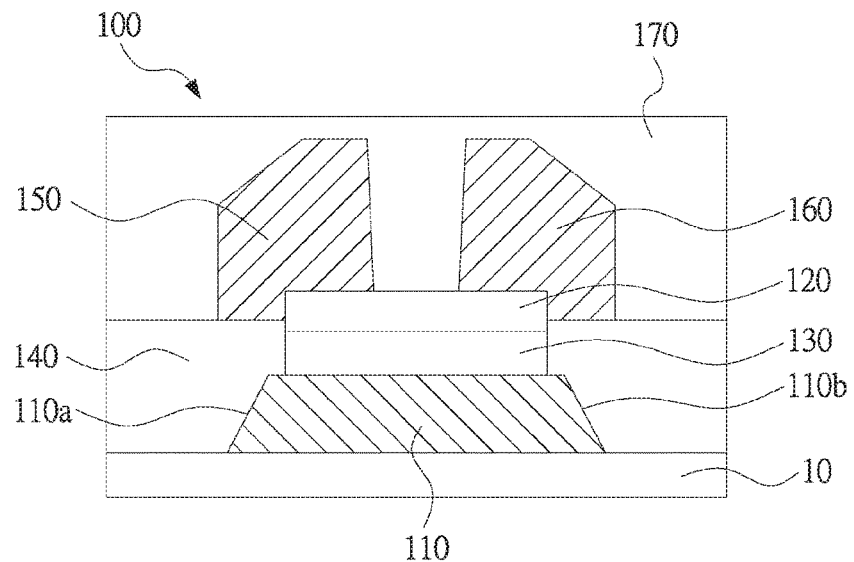
FIG. 1 is a schematic cross-sectional diagram of a thin film transistor according to a first embodiment.

The present disclosure will be described below in a more comprehensive manner with reference to the accompanying drawings, and exemplary embodiments of the present disclosure are shown in the accompanying drawings. As will be recognized by a person skilled in the art, the described embodiments may be modified in various different manners without departing from the spirit or scope of the present disclosure.

In the accompanying drawings, for clarity, thicknesses of elements are enlarged. In the entire specification, same reference numerals represent same elements. It should be understood that, when an element such as a layer, a film, an area, or a substrate is described to be "on another element", "connected to another element", or "overlap with another element", the element may be directly on the another embodiment or connected to the another element, or there may be an intermediate element. Conversely, when an element is described to be "directly on another element" or "directly connected to another element", there is no intermediate element. "Connection" used herein may be physical and/or electrical connection.

It should be understood that, the terms such as "first", "second", and "third" may be used herein to describe various elements, components, areas, layers, and/or parts, but the elements, the components, the areas, and/or the parts should not be limited by the terms. The terms are only used to distinguish an element, a component, an area, a layer, or a part from another element, another component, another area, another layer, or another part. Therefore, "a first element", "a first component", "a first area", "a first layer", or "a first part" discussed below may be referred to as a second element, a second component, a second area, a second layer, or a second part without departing from the teachings of this specification.

The terms used herein are merely used for describing specific embodiments, and are not limitative. As used herein, unless otherwise clearly indicated in this specification, the singular forms "a", "one", and "the" are intended to include plural forms, and include "at least one". "Or" represents "and/or". As used herein, the term "and/or" includes any or all combinations of one or more associated projects that are listed. It should also be understood that, in this specification, the terms "include" and/or "comprise" specify existence of the features, areas, entireties, steps, operations, elements, and/or components, but do not exclude existence or addition of one or more other features, areas, entireties, steps, operations, components, and/or a combination thereof.

In addition, the relative terms such as "below" or "bottom" and "above" or "top" may be used herein to describe a relationship between an element and another element, as shown in the figures. It should be understood that, the relative terms are intended to include different azimuths of devices except the azimuths shown in the figures. For example, if a device in one accompanying drawing is flipped, an element described to be on a "lower" side of another element is oriented to be on an "upper" side of the another element. Therefore, the exemplary term "lower" may include orientations of "lower" and "upper", and this depends on a specific orientation of the accompany drawing. Similarly, if a device in one accompanying drawing is flipped, an element described to be "below" another element or a "lower" element is oriented to be "above" the another element. Therefore, the exemplary term "below" or "lower" may include the orientations of above and below.

"Approximately", "substantially", or "similarly" used herein includes an average value within an acceptable deviation range of the described value and a particular value determined by a person of ordinary skill in the art, considering the discussed measurement and a particular quantity of errors related to the measurement (that is, limitation of a measurement system). For example, "approximately" may represent being within one or more standard deviations of the described value, or within ±30%, ±20%, ±10%, or ±5%.

Unless otherwise defined, all terms (including technical and scientific terms) used herein have meanings the same as those understood by a person of ordinary skill in the prior art of the present disclosure. It will be further understood that, terms that are defined in commonly used dictionaries should be interpreted as having meanings the same as the meanings of the terms used in associated technologies and in the context of the present disclosure, and will not be interpreted as idealized or excessively formal meanings, unless otherwise explicitly defined in this specification.

Exemplary embodiments are described herein with reference to cross-sectional views of schematic diagrams of idealized embodiments. Therefore, for example, graphic shape changes of results of the manufacturing technology and/or the tolerance may be anticipated. Therefore, the embodiments described herein should not be interpreted as being limited to the particular shape of the area shown in this specification, and instead, include, for example, a shape deviation caused by manufacturing. For example, an area shown or described to be flat may usually have rough and/or non-linear features. In addition, a shown acute angle may be round. Therefore, areas shown in the figures are substantially schematic, the shapes of the areas are not intended to show accurate shapes of the areas, and are not intended to limit the scope of the claims.

FIG. 1 is a schematic cross-sectional diagram of a thin film transistor according to a first embodiment. As shown in FIG. 1, the thin film transistor 100 includes a gate electrode 110, a semiconductor layer 120, a gate dielectric layer 130, a first dielectric layer 140, a source electrode 150, and a drain electrode 160. In the first embodiment, the gate electrode 110 is disposed on a substrate 10. Herein, the gate electrode 110 is stacked on the substrate 10. The semiconductor layer 120 is disposed on the substrate 10, and the semiconductor layer 120 overlaps with the gate electrode 110. In other words, a vertical projection scope (or namely area) of the semiconductor layer 120 on the substrate 10 at least partially overlaps with a vertical projection scope (or namely area) of the gate electrode 110 on the substrate 10. The gate dielectric layer 130 is disposed between the gate electrode 110 and the semiconductor layer 120. In this embodiment, a vertical projection scope of the gate dielectric layer 130 on the substrate 10 is substantially the same as the vertical projection scope of the semiconductor layer 120 on the substrate 10. Herein, the substantially same vertical projection scopes between the semiconductor layer 120 and the gate dielectric layer 130 have a tolerance of less than 10%. In addition, the gate dielectric layer 130 and the semiconductor layer 120 are preferably etched in one step such that the gate dielectric layer 130 and the semiconductor layer 120 have substantially the same pattern and/or size. The first dielectric layer 140 is disposed on the substrate 10. The first dielectric layer 140 covers two sides of the gate electrode 110. The dielectric constant of the first dielectric layer 140 is less than the dielectric constant of the gate dielectric layer 130, and the dielectric constant of the first dielectric layer 140 is less than 4 and greater than 0. The source electrode 150 and the drain electrode 160 are disposed on the substrate 10, the source electrode 150 and the drain electrode 160 are separated and are not connected to each other, and the source electrode 150 and the drain electrode 160 separately contact the semiconductor layer 120. In the present embodiment, the first dielectric layer 140 covers two sides 110a and 110b of the gate electrode 110, for example, the first dielectric layer 140 directly contacts the two sides of the gate electrode 110, a vertical projection area of the first dielectric layer 140 on the substrate 10 surrounds the vertical projection area of the gate electrode 110 on the substrate 10, and a vertical projection area of the first dielectric layer 140 partially overlaps with a vertical projection area of the gate electrode 110.

In the present embodiment, the first dielectric layer 140 may further surround the gate dielectric layer 130 and the semiconductor layer 120, and contact the source electrode 150 and the drain electrode 160. Herein, an implementation is that the gate electrode 110 and the gate dielectric layer 130 are embedded in the first dielectric layer 140. Generally, the gate dielectric layer 130 uses a material having a high K (meaning the dielectric constant is greater than 4). Generally, the gate dielectric layer 130 is usually made of an inorganic insulating material. For example, the gate dielectric layer 130 may be made of aluminum oxide, silicon oxide, silicon nitride, or titanium oxide, but the present disclosure is not limited thereto. The Young's modulus of the gate dielectric layer 130 is usually in a range substantially of 60 GPa to 450 GPa, and preferably, 65 GPa to 80 GPa, 160 GPa to 300 GPa, or 210 GPa to 420 GPa. The first dielectric layer 140 uses an insulating material whose dielectric constant is less than or substantially equal to 4 and greater than 0. The Young's modulus of the first dielectric layer 140 is generally less than about 5 GPa, and preferably, about 2 GPa to about 4.5 GPa. Generally, the first dielectric layer 140 is usually made of an organic material or a similar organic material. For example, the first dielectric layer 140 may be made of polyimide (PI), poly(4-vinyl phenyl) (or abbreviation PVP), poly(vinyl alcohol) (or abbreviation PVA), poly (methyl methacrylate) (or abbreviation PMMA), polypropylene (PP), or benzocyclobutene (BCB), but the present disclosure is not limited thereto. In addition, the first dielectric layer 140 may also be made of a similar organic material such as a siloxane (SOC) polymer, a silsesquioxane polymer, a ferroelectric polymer, or a silicon carbide (SiC) polymer, etc., but the present disclosure is not limited thereto. The first dielectric layer 140 has relatively good flexibility, and therefore the thin film transistor 100 can be applied to various flexible photoelectric devices.

In addition, the substrate 10 is preferably made of a flexible material, such as polyamide (PA), PI, PMMA, polyethylene naphthalate (PEN), polyethylene terephthalate (PET), glass fiber reinforced plastics (FRP), polyetheretherketone (PEEK), epoxy resin, another proper material, or a combination of at least two of the foregoing materials. In other words, the flexible material of the substrate 10 may be a mixture of only organic materials, a mixture of an organic material and an inorganic material, a material formed through bonding of organic molecules and inorganic molecules, or another proper material. The material of the substrate 10 is not limited to the foregoing materials, and may be glass, quartz, an organic polymer, an opaque/reflective material (for example: a conductive material, a metal, a wafer, a ceramic, or another proper material), a combination of at least two of the foregoing materials, or another proper material. The semiconductor layer 120 may be made of a metal oxide or silicon, for example, an indium tin oxide (ITO), an aluminum zinc oxide (AZO), an indium gallium zinc oxide (IGZO), an indium tin zinc oxide (ITZO), an indium gallium zinc tin oxide (IGZTO), monocrystalline silicon, polycrystalline silicon, or amorphous silicon. The foregoing materials are merely examples, but the material of the semiconductor layer 120 is not limited thereto.

In the embodiment of FIG. 1, the thin film transistor 100 further includes a protective layer 170. The protective layer 170 is disposed on the substrate 10, and contacts the semiconductor layer 120, the first dielectric layer 140, the source electrode 150, and the drain electrode 160. That is, the protective layer 170 covers the semiconductor layer 120, the first dielectric layer 140, the source electrode 150, and the drain electrode 160. In this embodiment, the thin film transistor 100 is a bottom gate thin film transistor. However, the present disclosure is not limited thereto. The thin film transistor 100 of the present disclosure may be a top gate thin film transistor or a transistor of another proper type.

Figure 2:
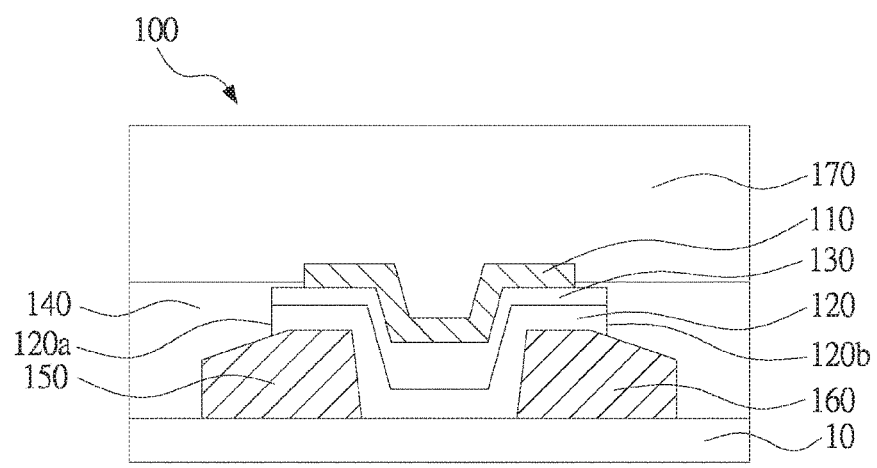
FIG. 2 is a schematic cross-sectional diagram of a thin film transistor according to a second embodiment.

FIG. 2 is a schematic cross-sectional diagram of a thin film transistor according to a second embodiment. As shown in FIG. 2, an implementation is that the thin film transistor 100 of the second embodiment is a top gate thin film transistor. A semiconductor layer 120 is disposed on a substrate 10. A source electrode 150 and a drain electrode 160 are disposed on the substrate 10, the source electrode 150 is separated from the drain electrode 160, and the source electrode 150 and the drain electrode 160 are not connected to each other. Moreover, the source electrode 150 and the drain electrode 160 separately contact the semiconductor layer 120. The semiconductor layer 120 is disposed on the source electrode 150 and the drain electrode 160. A gate dielectric layer 130 is disposed on the semiconductor layer 120. A gate electrode 110 vertically overlaps with the semiconductor layer 120, and the gate dielectric layer 130 is disposed between the gate electrode 110 and the semiconductor layer 120. A first dielectric layer 140 is disposed on the substrate 10, and the first dielectric layer 140 covers two sides 120a and 120b of the semiconductor layer 120. Herein, a vertical projection scope of the semiconductor layer 120 on the substrate 10 at least partially overlaps with a vertical projection scope of the gate electrode 110 on the substrate 10. A vertical projection scope of the gate dielectric layer 130 on the substrate 10 is substantially the same as the vertical projection scope of the semiconductor layer 120 on the substrate 10. Herein, the substantially same vertical projection scopes between the semiconductor layer 120 and the gate dielectric layer 130 have a tolerance less than 10%. Materials of the gate dielectric layer 130 and the first dielectric layer 140 are the same as those of the gate dielectric layer 130 and the first dielectric layer 140 that are in FIG. 1, and details are not described herein again.

In FIG. 2, the first dielectric layer 140 covers the semiconductor layer 120, the gate dielectric layer 130, the source electrode 150, and the drain electrode 160, and only a cross section is shown herein. In fact, the first dielectric layer 140 may surround the gate dielectric layer 130, the source electrode 150, and the drain electrode 160. Herein, another implementation is that the semiconductor layer 120 and the gate dielectric layer 130 are embedded in the first dielectric layer 140. Further, the first dielectric layer 140 may further surround at least one part of sides of the gate electrode 110 and sides of the gate dielectric layer 130. In addition, the protective layer 170 is disposed on the substrate 10, and contacts the gate electrode 110 and the first dielectric layer 140. The second embodiment is reversion of the first embodiment, so that the gate electrode 110 is disposed above the semiconductor layer 120, and the semiconductor layer 120 is on the source electrode 150 and the drain electrode 160. In addition, in the second embodiment, the thin film transistor 100 further includes the protective layer 170. The protective layer 170 is disposed on the substrate 10, and covers the gate electrode 110 and the first dielectric layer 140.

Figure 3:
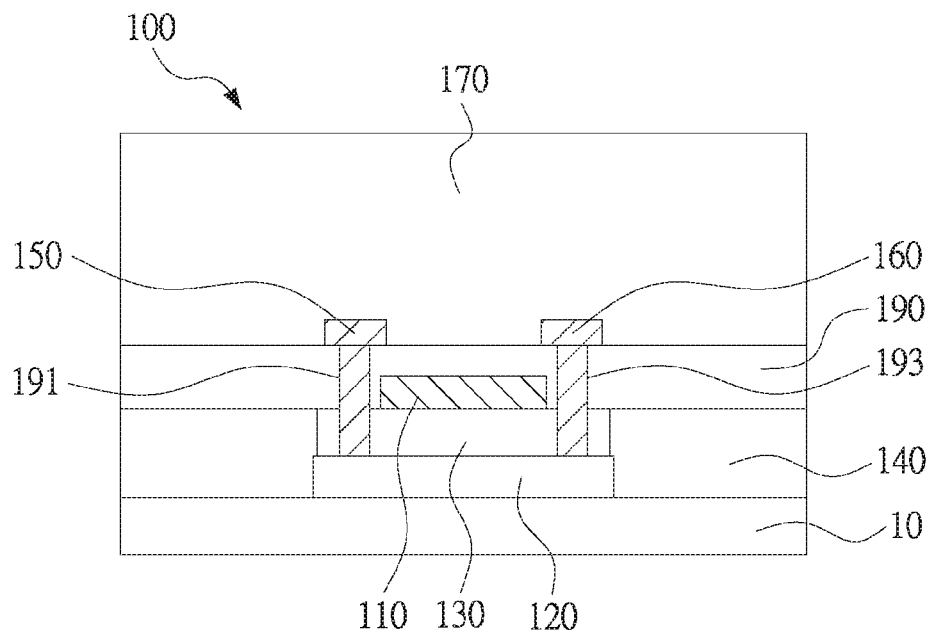
FIG. 3 is a schematic cross-sectional diagram of a thin film transistor according to a third embodiment.

FIG. 3 is a schematic cross-sectional diagram of a thin film transistor according to a third embodiment. The third embodiment is an implementation of another top gate thin film transistor. That is, a gate electrode 110 is located above a semiconductor layer 120. The thin film transistor 100 of the third embodiment further includes a protective layer 170. As shown in FIG. 3, a semiconductor layer 120 is disposed on a substrate 10. The gate electrode 110 overlaps with the semiconductor layer 120. A gate dielectric layer 130 is disposed between the gate electrode 110 and the semiconductor layer 120. A first dielectric layer 140 covers two sides of the semiconductor layer 120 and the gate dielectric layer 130. That is, the semiconductor layer 120 and the gate dielectric layer 130 are embedded in the first dielectric layer 140. An insulation layer 190 is disposed on the semiconductor layer 120. Herein, the protective layer 170 does not contact the semiconductor layer 120. The insulation layer 190 directly contacts the gate electrode 110, the gate dielectric layer 130, and the first dielectric layer 140. In addition, the insulation layer 190 and the gate dielectric layer 130 are further provided with a first contact hole 191 and a second contact hole 193, respectively. The source electrode 150 and the drain electrode 160 are separated from each other, and do not contact each other. Moreover, the source electrode 150 and the drain electrode 160 contact the semiconductor layer 120 through the first contact hole 191 and the second contact hole 193, respectively. Further, the protective layer 170 covering the thin film transistor 100 may be further included.

Figure 4:
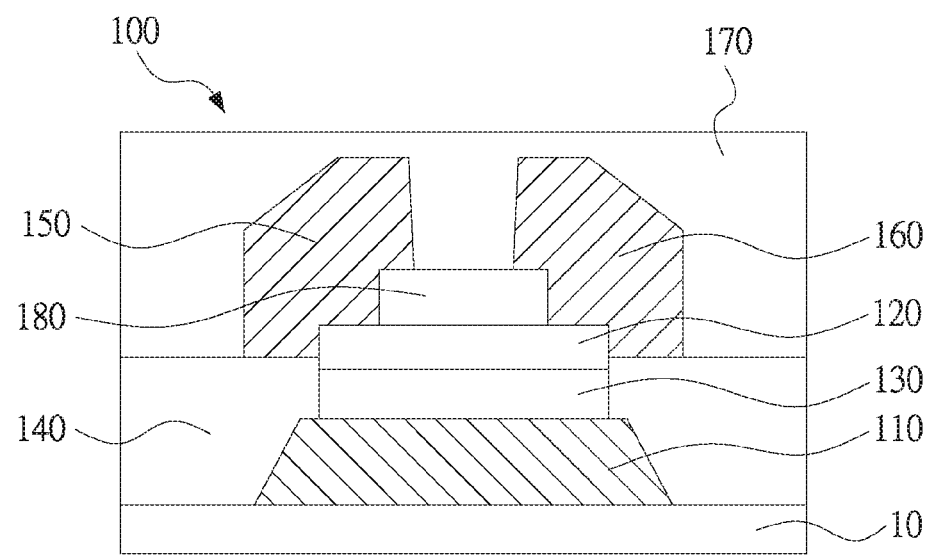
FIG. 4 is a schematic cross-sectional diagram of a thin film transistor according to a fourth embodiment.

FIG. 4 is a schematic cross-sectional diagram of a thin film transistor according to a fourth embodiment. As shown in FIG. 4, the fourth embodiment is a variation based on the first embodiment. A difference is that, the thin film transistor 100 of the fourth embodiment further includes an etch stop layer 180 disposed on a semiconductor layer 120. When the semiconductor layer 120 is patterned, the etch stop layer 180 may avoid over etching of the patterned semiconductor layer 120. Details, which are the same as those of the first embodiment, of the fourth embodiment are not described herein again. In the present embodiment, the source electrode 150 and the drain electrode 160 are respectively disposed on a portion of the etch stop layer 180.

Figure 5:
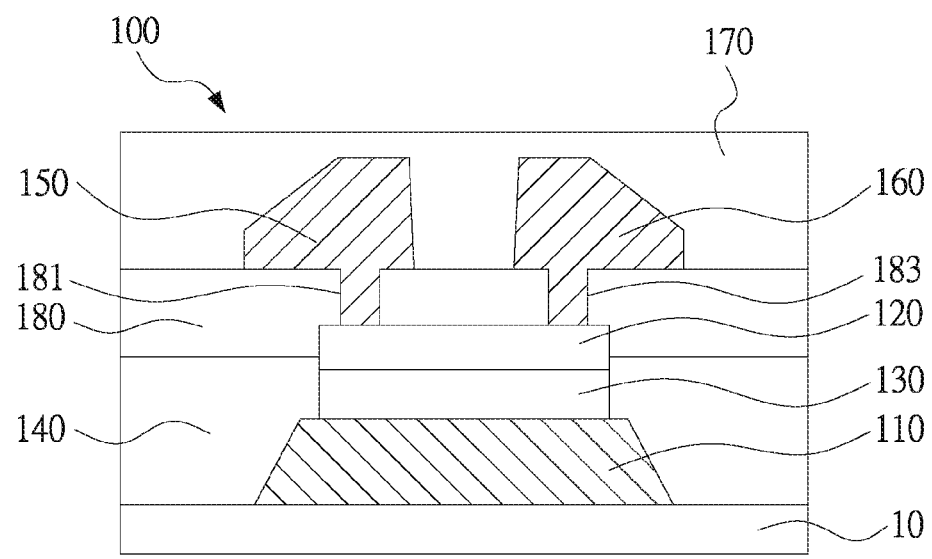
FIG. 5 is a schematic cross-sectional diagram of a thin film transistor according to a fifth embodiment.

FIG. 5 is a schematic cross-sectional diagram of a thin film transistor according to a fifth embodiment. As shown in FIG. 5, the fifth embodiment is a further variation based on the fourth embodiment. In the fifth embodiment, an etch stop layer 180 is not only disposed on a semiconductor layer 120, but also disposed on a first dielectric layer 140, so that a source electrode 150 and a drain electrode 160 do not contact the first dielectric layer 140. In addition, the etch stop layer 180 has a first contact hole 181 and a second contact hole 183. The source electrode 150 and the drain electrode 160 are separated from each other, and do not contact each other. Moreover, the source electrode 150 and the drain electrode 160 contact the semiconductor layer 120 through the first contact hole 181 and the second contact hole 183, respectively.

Figure 6:
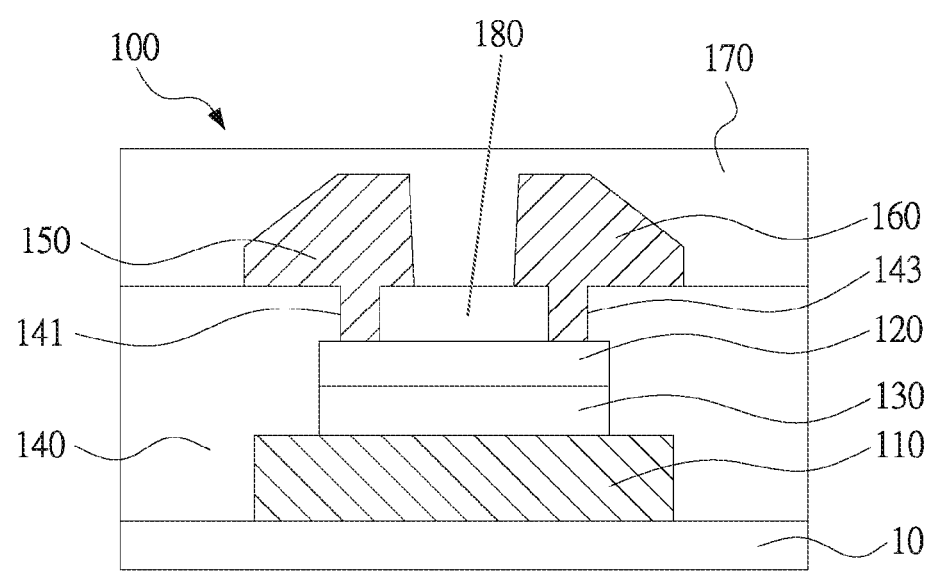
FIG. 6 is a schematic cross-sectional diagram of a thin film transistor according to a sixth embodiment.

FIG. 6 is a schematic cross-sectional diagram of a thin film transistor according to a sixth embodiment. As shown in FIG. 6, the sixth embodiment is a further variation based on the fifth embodiment. In the sixth embodiment, an etch stop layer 180 and a first dielectric layer 140 are formed of a same layer, so that manufacturing steps may be reduced. That is, the etch stop layer 180 and the first dielectric layer 140 are formed by an organic material or a similar organic material whose dielectric constant is less than the dielectric constant of a gate dielectric layer 130 and whose dielectric constant is less than 4 and greater than 0. In the present embodiment, a gate electrode 110, a semiconductor layer 120, and the gate dielectric layer 130 are all surrounded by the first dielectric layer 140. For example, the first dielectric layer 140 covers the semiconductor layer 120 and the gate electrode 110. Therefore, the first dielectric layer 140 is contact a part of upper surface of the semiconductor layer 120, the side of the semiconductor layer 120, the side of the gate dielectric layer 130, a part of upper surface of the gate electrode 110, and the side of the gate electrode 110. A source electrode 150 and a drain electrode 160 are separated from each other, and do not contact each other. Moreover, the source electrode 150 and the drain electrode 160 contact the semiconductor layer 120 through a first contact hole 141 and a second contact hole 143 respectively. Materials of the gate dielectric layer 130 and the first dielectric layer 140 that are in the sixth embodiment are the same as those of the gate dielectric layer 130 and the first dielectric layer 140 that are in the first embodiment, and details are not described herein again.

Figure 7:
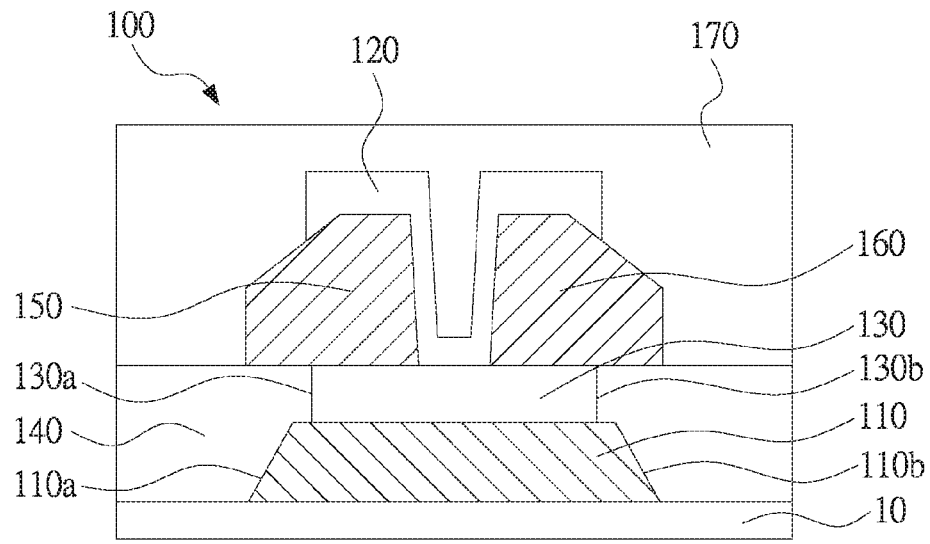
FIG. 7 is a schematic cross-sectional diagram of a thin film transistor according to a seventh embodiment.

FIG. 7 is a schematic cross-sectional diagram of a thin film transistor according to a seventh embodiment. As shown in FIG. 7, in the seventh embodiment, a semiconductor layer 120 is a co-planer thin film transistor. The thin film transistor 100 also includes a gate electrode 110, the semiconductor layer 120, a gate dielectric layer 130, a first dielectric layer 140, a source electrode 150, and a drain electrode 160. In the seventh embodiment, the gate electrode 110 is disposed on a substrate 10. The gate dielectric layer 130 is located on the gate electrode 110. The first dielectric layer 140 covers two sides 110a and 110b of the gate electrode 110 and two sides 130a and 130b of the gate dielectric layer 130. The source electrode 150 and the drain electrode 160 are disposed on the substrate 10. The source electrode 150 and the drain electrode 160 are separated from each other, and do not contact each other. Moreover, the source electrode 150 and the drain electrode 160 respectively contact the gate dielectric layer 130 and the first dielectric layer 140. The semiconductor layer 120 is disposed on the substrate 10. Herein, it indicates that the semiconductor layer 120 is disposed on the source electrode 150, the drain electrode 160, and the part of the gate dielectric layer 130. In addition, a protective layer 170 is further disposed on the substrate 110, and contacts the semiconductor layer 120, the first dielectric layer 140, the source electrode 150, and the drain electrode 160.

The foregoing various embodiments are merely examples, and are not intended to be limitative. Various collocations and combinations may be implementations that are actually applicable.

Figure 8:
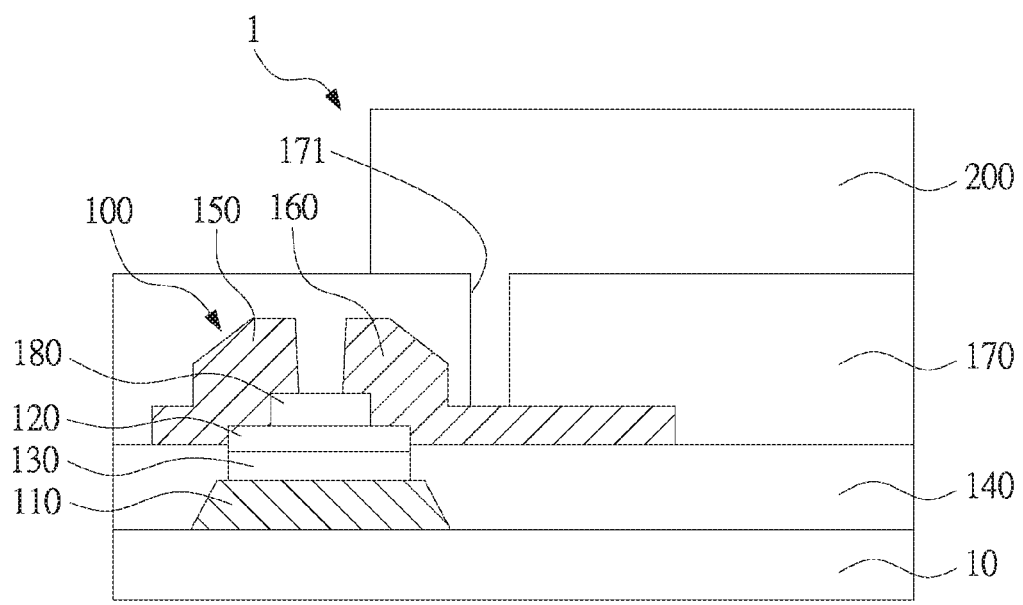
FIG. 8 is a schematic cross-sectional diagram of a photoelectric device.

FIG. 8 is a schematic cross-sectional diagram of a photoelectric device. FIG. 8 is cross-sectional view taken along line A-A' of FIG. 9. As shown in FIG. 8, the photoelectric device 1 includes a thin film transistor 100, a protective layer 170, and an optical element 200. The thin film transistor 100 may be any implementation of the foregoing embodiments. Only the thin film transistor 100 of the fourth embodiment is used as an example, but the present disclosure is not limited thereto. Herein, the first dielectric layer 140 further covers the other parts of the substrate 10. The protective layer 170 covers the thin film transistor 100 and the first dielectric layer 140. The protective layer 170 is provided with a through hole 171, and the through hole 171 corresponds to the source electrode 150 or the drain electrode 160. The optical element 200 is electrically connected to the source electrode 150 or the drain electrode 160 through the through hole 171, so that the optical element 200 may be controlled by using the thin film transistor 100. Herein, the optical element 200 may be a self-illumination layer, a non-self-illumination layer, a photo sensing layer, a display element, an electrochromic element, or other suitable element, or at least two element combinations thereof. Moreover, the optical element 200 is electrically connected to the source electrode 150 or the drain electrode 160 of the thin film transistor 100, so that the optical element 200 is controlled by the thin film transistor 100. The actual implementation is described in detail later.

Figure 9:
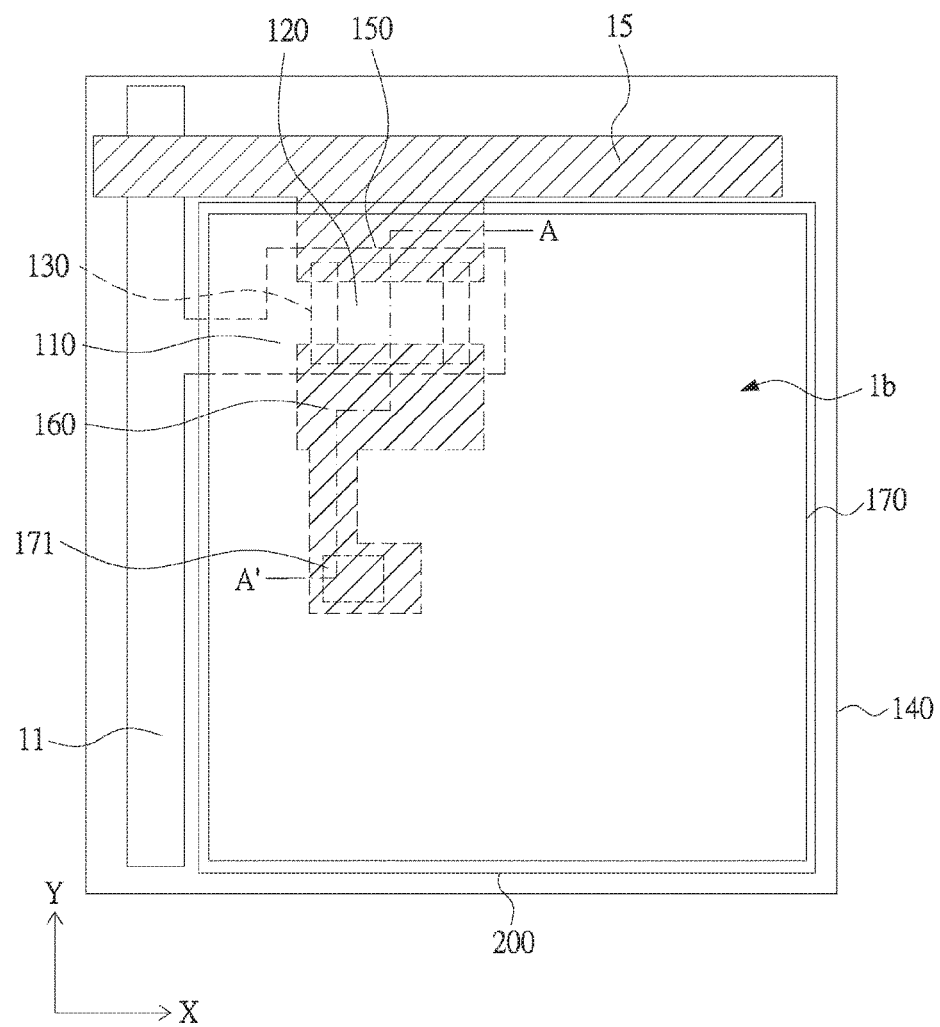
FIG. 9 is a partial schematic top view of a photoelectric device.
Figure 10:
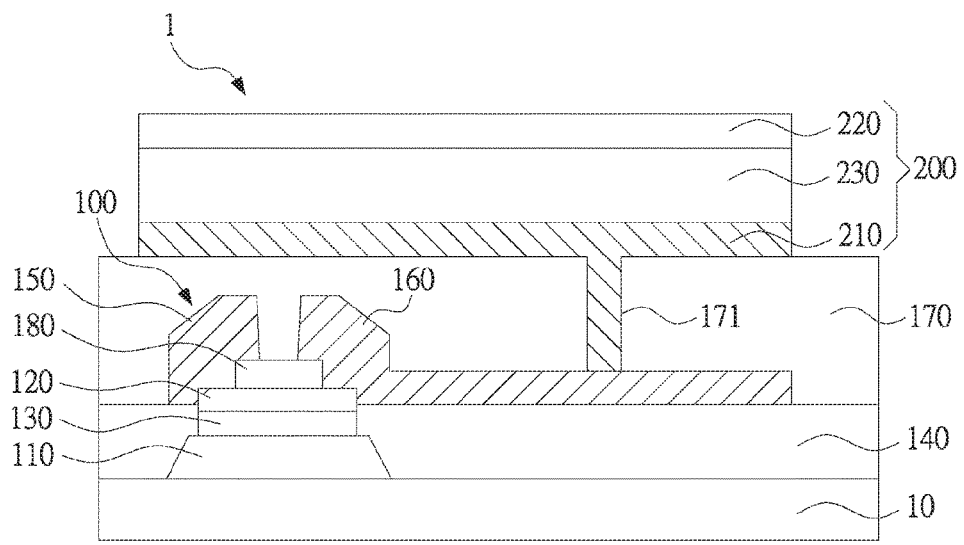
FIG. 10 is a schematic cross-sectional diagram of a photoelectric device according to a first embodiment.
Figure 11:
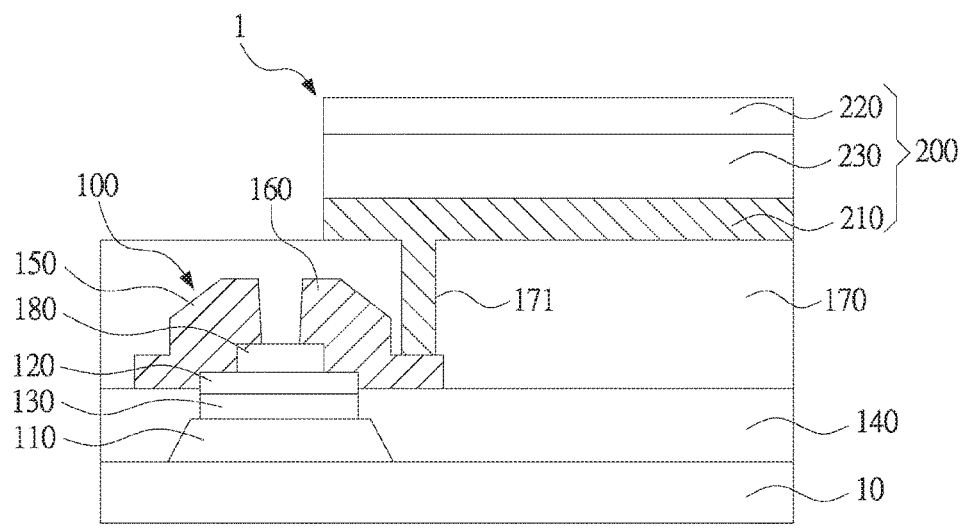
FIG. 11 is a schematic cross-sectional diagram of a photoelectric device according to a second embodiment.
Figure 12:
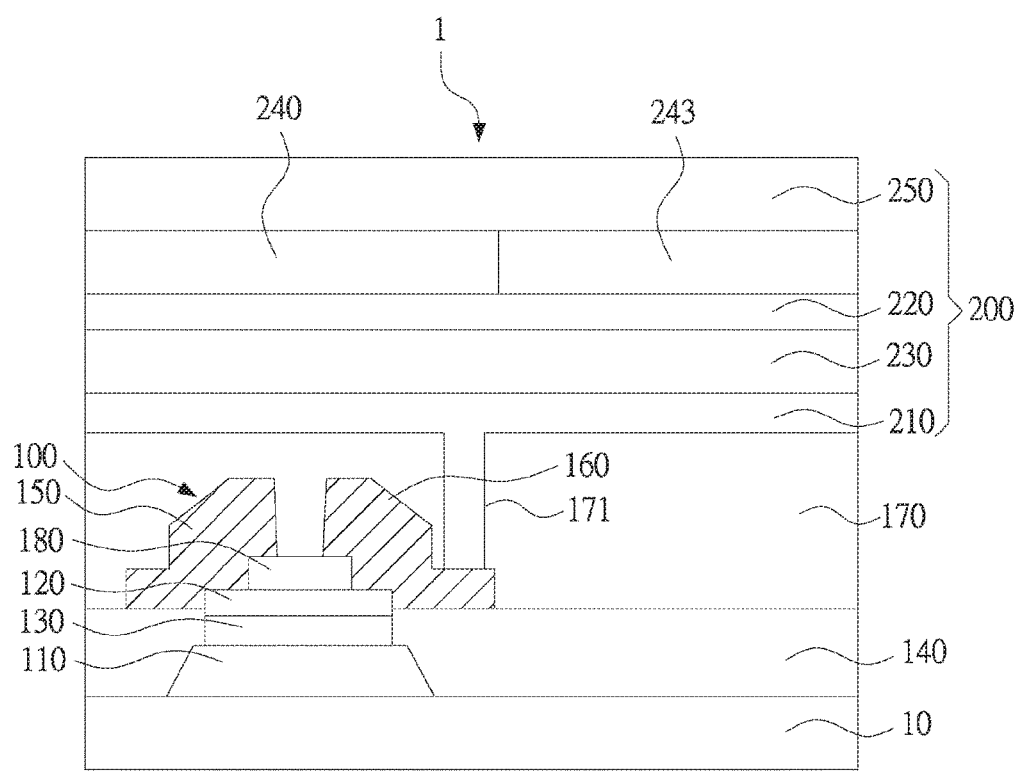
FIG. 12 is a schematic cross-sectional diagram of a photoelectric device according to a third embodiment.

FIG. 9 is a partial schematic top view of a photoelectric device, and FIG. 10 to FIG. 12 are cross-sectional views taken along line A-A' of FIG. 9 as a first embodiment, a second embodiment, and a third embodiment of a photoelectric device. FIG. 9 to FIG. 12 are exemplary descriptions of the optical element of FIG. 8, and an implementation of the photoelectric device 1 is not limited thereto. As shown in FIG. 9, a cross section of the line A-A' of FIG. 9 corresponds to FIG. 8. As shown in FIG. 9, a gate line 11 and a data line 15 are disposed in an area of the optical element 200 in an interlaced manner. A gate dielectric layer 130 is disposed between a gate electrode 110 and a source electrode 150/drain electrode 160, and is below a semiconductor layer 120 or below the drain electrode 160. A first dielectric layer 140 and a protective layer 170 are further located in a device area 1b, that is, an area in which the gate line 11 and the data line 15 are interlaced except an area between the gate electrode 110 and the source electrode 150/drain electrode 160 and an area below the semiconductor layer 120 or an area below the drain electrode 160.

In FIGS. 10 to 12, the structure of a thin film transistor 100, extension of a first dielectric layer 140, and a protective layer 170 are similar to those of FIG. 8, and details are not described again. In FIG. 10, an optical element 200 is an optical sensing element, and is disposed on a substrate 10. In the embodiments, the optical element 200 contacts the protective layer 170, but does not directly contact the substrate 10. The optical element 200 includes a first electrode 210, a second electrode 220, and an optical layer 230. For example, the optical layer 230 includes a first-type semiconductor material layer, an intrinsic semiconductor material layer, and a second-type semiconductor material layer, but is not limited thereto. Moreover, one of the first-type semiconductor material layer or the second-type semiconductor material layer is a p-type semiconductor material, and the other one is an n-type semiconductor material. The first electrode 210 and the second electrode 220 may be transparent electrodes or non-transparent electrodes. The first electrode 210 is preferably a non-transparent electrode, and the second electrode 220 is preferably a transparent electrode. For example, a transparent conductive material is an ITO, an indium zinc oxide, an aluminum tin oxide, an AZO, an indium germanium zinc oxide, graphene, nano-silver, carbon nano tube/pole, another proper oxide, or a stacked layer of at least two of the foregoing materials. However, the present disclosure is not limited thereto. For example, the non-transparent conductive material is a metal, an alloy, a metal nitride, a metal oxide, a metal oxy-nitride, another proper material, or a stacked layer of at least two of the foregoing materials. However, the present disclosure is not limited thereto. The optical layer 230 is located between the first electrode 210 and the second electrode 220, and the first electrode 210 is electrically connected to a drain electrode 160 through a through hole 171. This case is only an example, and the second electrode 220 may be electrically connected to the drain electrode 160 through the through hole 171. Therefore, the optical element 200 is controlled by the thin film transistor 100, and may sense a pressed area, a fingerprint, or the like.

As shown in FIG. 11, an optical element 200 may also be a self-emitting element such as a light emitting diode or an organic light emitting diode. Herein, a first electrode 210 or a second electrode 220 may be used as anode or cathode. The first electrode 210 is electrically connected to a source electrode 150 or a drain electrode 160. Further, the first electrode 210 and the second electrode 220 may be transparent electrodes or non-transparent electrodes. Details of the transparent electrodes and the non-transparent electrodes are described as above. Herein, the optical element 200 is controlled and driven by the thin film transistor 100, and the optical element 200 emits light or does not emit light.

As shown in FIG. 12, an optical element 200 may also be a liquid crystal display element, and a first electrode 210 and a second electrode 220 are preferably transparent conductive materials. Details of a transparent electrode are described as above. In addition, an optical layer 230 is a display medium layer. For example, the optical layer is a polymer dispersed liquid crystal (PDLC) layer, a polymer network liquid crystal (PNLC) layer, a cholesteric liquid crystal layer, an electrochromic layer, or another display medium layer that is driven by using a vertical electric field or using a horizontal electric field. However, the material of the optical layer 230 and driving modes of the first electrode 210 and the second electrode 220 can be properly selected by a person skilled in the art according to demands. The optical element 200 further includes a protective substrate 250. A black matrix 243 and a color filter layer 240 are located on an internal surface of a substrate or the protective substrate 250. This can be properly selected by a person skilled in art according to demands. The optical layer 230 is disposed between the substrate 10 and the protective substrate 250. Herein, a first electrode 210 is a pixel electrode, and a vertical projection area of the first electrode 210 on the substrate 10 at least partially overlaps with a vertical projection area of the first dielectric layer 140 on the substrate 10. Herein, the optical element 200 is driven by the thin film transistor 100. A voltage difference between the first electrode 210 and the second electrode 220 is controlled so that a display medium can form a display mode.

Figure 13A:
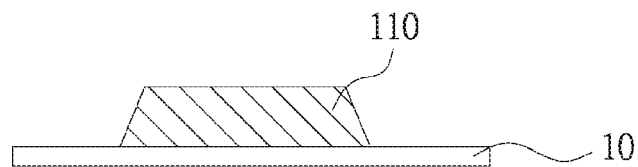
FIG. 13a, FIG. 13b, FIG. 13c, and FIG. 13d are schematic cross-sectional diagrams of a manufacturing process of a thin film transistor according to a comparative example.

FIG. 13a, FIG. 13b, FIG. 13c, and FIG. 13d are schematic cross-sectional diagrams of a manufacturing process of a thin film transistor according to a comparative example. FIG. 14a, FIG. 14b, FIG. 14c, and FIG. 14d are schematic cross-sectional diagrams of a manufacturing process of a thin film transistor according to an embodiment. A difference between the comparative example and the embodiment is that, a gate insulating material 13 of the comparative example does not include an inorganic material and the first dielectric layer 140 in the embodiment, and the gate insulating material 13 of the comparative example fully covers the gate electrode 110 and the substrate 10. In other words, the gate insulating material 13 of the comparative example is fully formed by an organic material. As shown in FIG. 13a and FIG. 14a, a gate electrode 110 is manufactured on a substrate 10. The gate electrode 110 of the comparative example is similar to that of the embodiment, and may be manufactured by using a same mask.

Figure 13B:
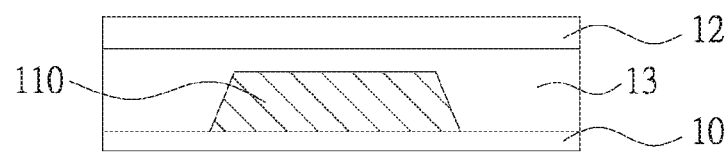
Figure 13C:
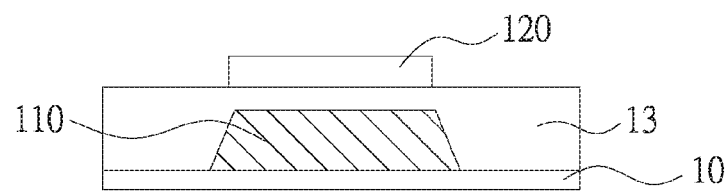
Figure 14A:
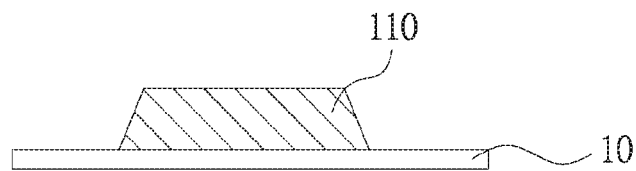
FIG. 14a, FIG. 14b, FIG. 14c, FIG. 14d, and FIG. 14e are schematic cross-sectional diagrams of a manufacturing process of a thin film transistor according to an embodiment.
Figure 14B:
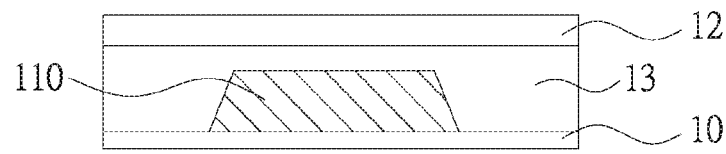
Figure 14C:
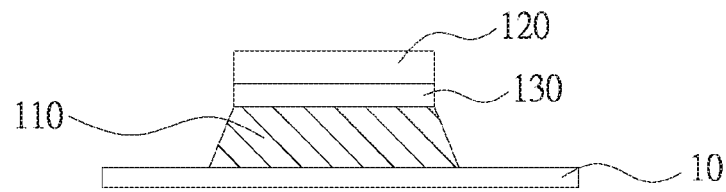

In FIG. 13b, the gate insulating material 13 and a semiconductor material 12 are formed on the gate electrode 110 in sequence. In FIG. 13c, lithography and etching are performed on the semiconductor material 12, forming a semiconductor layer 120. In the comparative example, the gate insulating material 13 fully covering the gate electrode 110 and the substrate 10 may be used as a gate dielectric layer 130. In FIG. 14b, a gate insulating material 13 and a semiconductor material 12 are formed on the gate electrode 110 in sequence. In FIG. 14c, lithography and etching are performed on the gate insulating material 13 and the semiconductor material 12, and a patterned semiconductor layer 120 and a patterned gate dielectric layer 130 are formed at the same time. In the embodiment, the patterned semiconductor layer 120 and the patterned gate dielectric layer 130 may be directly formed by means of dry etching or plasma etching.

Figure 13D:
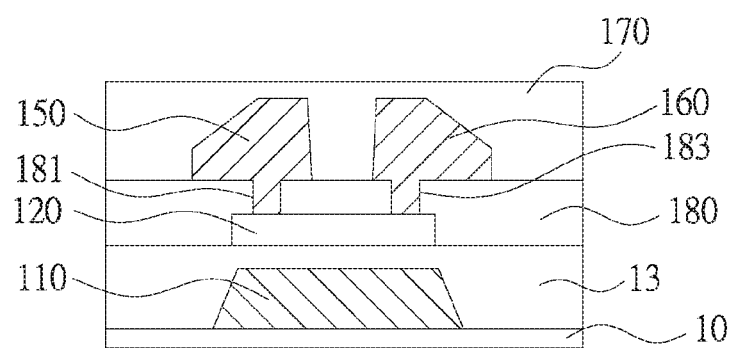
Figure 14D:
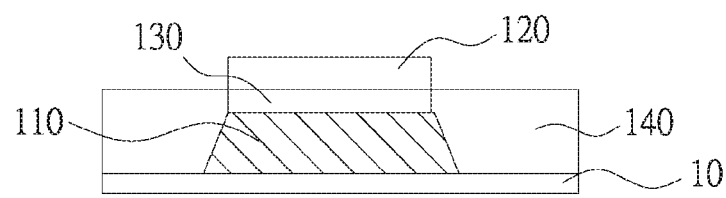
Figure 14E:
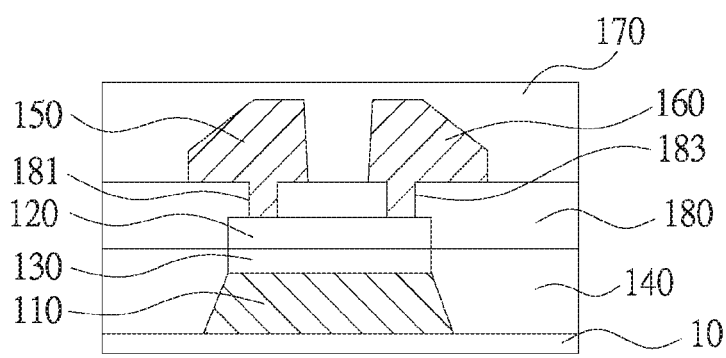

As shown in FIG. 13d, FIG. 14d, and FIG. 14e, compared with the comparative example, in this embodiment, only a step of forming a first dielectric layer 140 is added, and the subsequent manufacturing procedure is similar to that in the comparative example. That is, the comparative example and the embodiment may use the same quantity of masks. Therefore, even though the first dielectric layer 140 is added, the manufacturing costs and manufacturing time are not greatly increased.

Figure 15A:
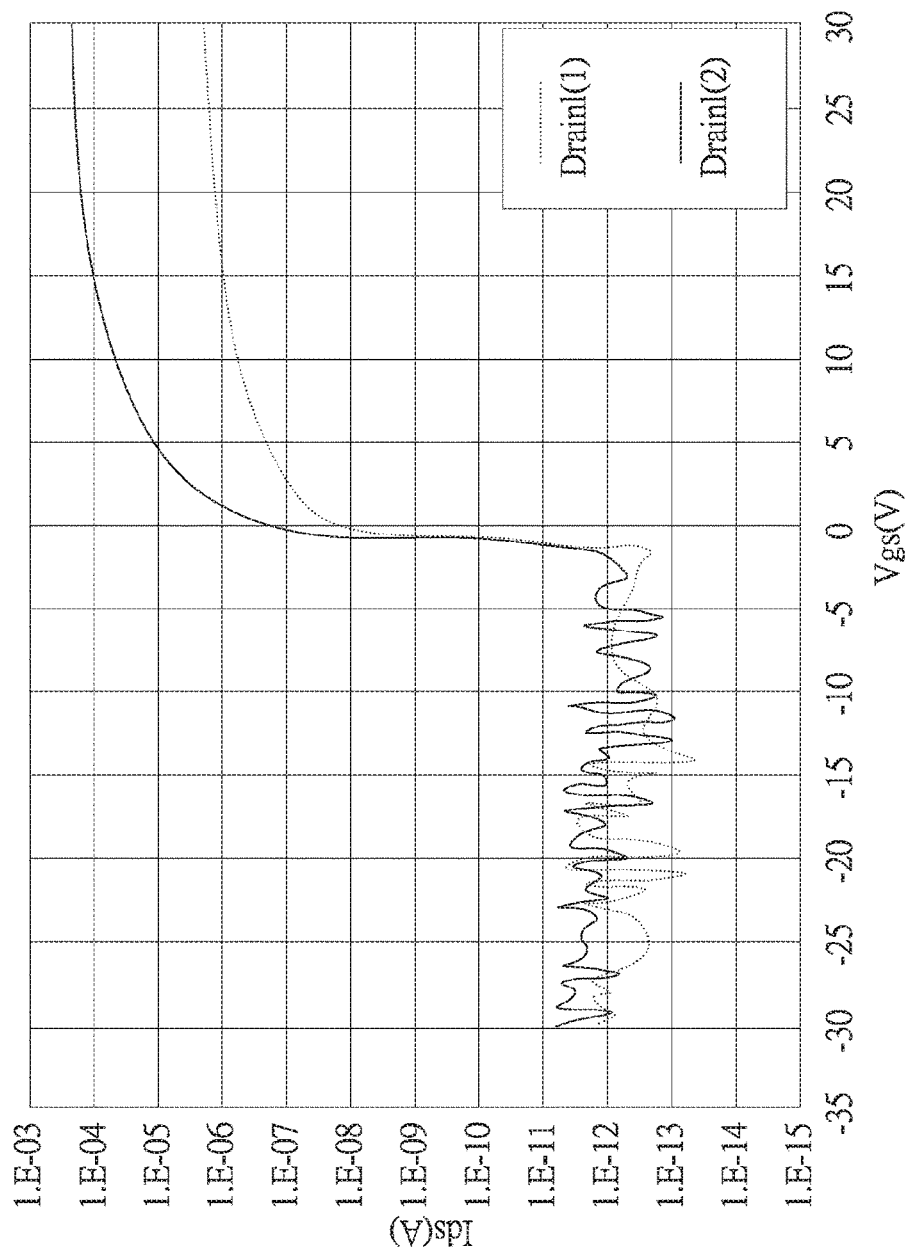
FIG. 15a is an I-V curve of a thin film transistor according to an comparative example.
Figure 15B:
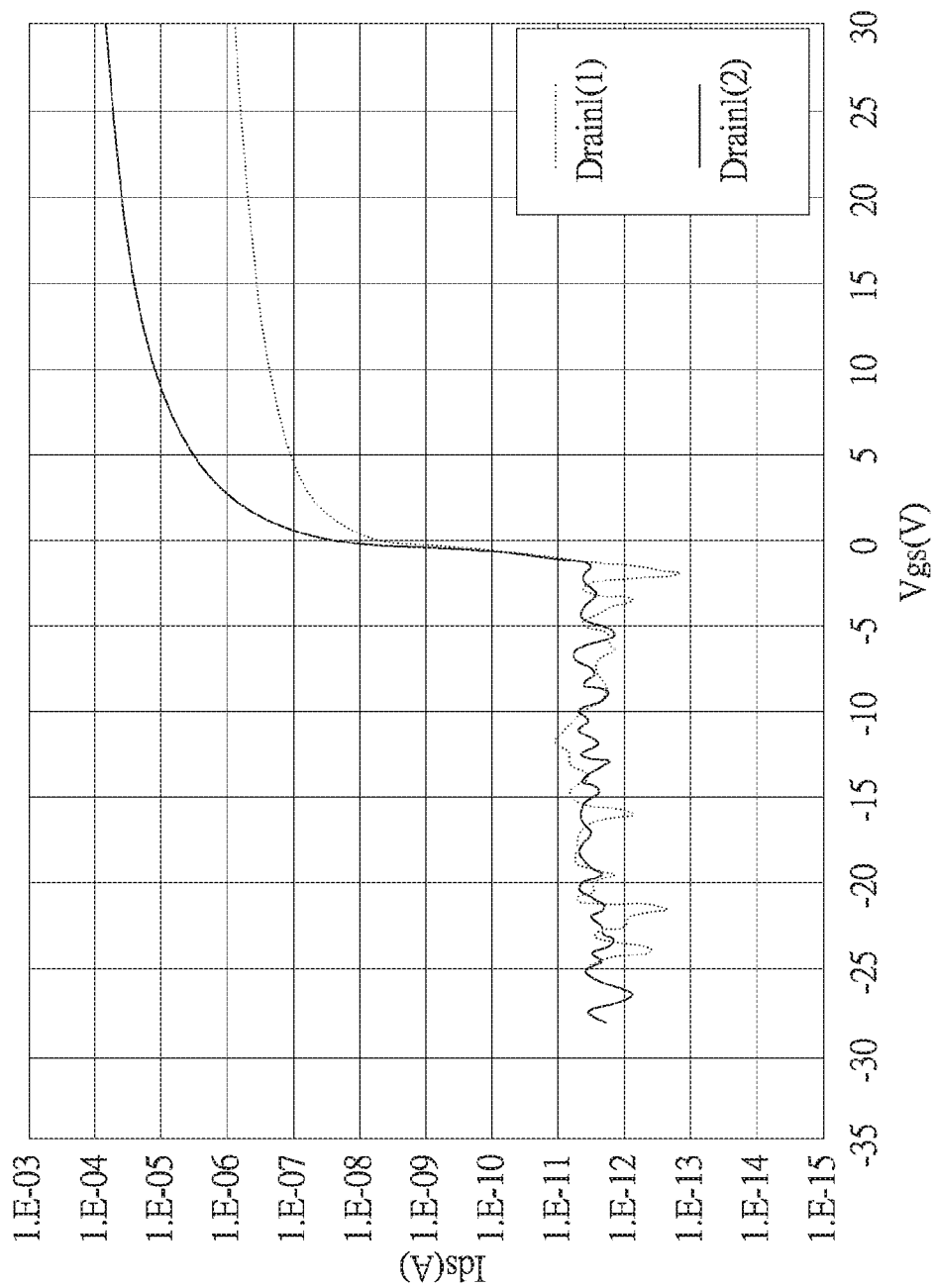
FIG. 15b is an I-V curve of a thin film transistor according to a first embodiment.

Table 1 is actual test data of the comparative example and the embodiment. As shown in Table 1, the I-V curve of the embodiment is approximately similar to the I-V curve of the comparative embodiment. As shown in FIGS. 15a, and 15b, in detail, the threshold voltage (Vth), sub-threshold swing (S.S), and the electronic mobility of the embodiment are relatively high, but fall within a same level range.

TABLE 1

|  | Comparative example | Embodiment |
| --- | --- | --- |
| Threshold voltage (Vth) | −0.97 V | −0.51 V |
| Sub-threshold swing (S.S) | 0.25 (mV/dec) | 0.42 (mV/dec) |
| Electronic mobility | 13.5 (cm$^2$/V · s) | 14.2 (cm$^2$/V · s) |

Based on the above, in any one of the foregoing embodiments, in the thin film transistor 100, the first dielectric layer 140 covers two sides of the gate and/or the semiconductor layer, and the first dielectric layer 140 is a material whose dielectric constant is less than 4 and greater than 0. The first dielectric layer 140 has relatively good flexibility, so that the thin film transistor 100 can be applied to a flexible photoelectric device. Meanwhile, a gate dielectric insulation layer 130 contacts the gate electrode 110 and the semiconductor layer 120, to maintain the electrical property. Further, a quantity of masks during the process is not increased, and costs are not greatly increased.

Although the present disclosure has been disclosed above with the embodiments, the embodiments are not intended to limit the present disclosure. Any person skilled in the art may make various modifications and improvements without departing from the spirit and scope of the present disclosure. Therefore, the protection scope of the present disclosure shall be subject to the protection scope of the claims.

What is claimed is:

1. A thin film transistor, comprising:
    a gate electrode, disposed on a substrate;
    a semiconductor layer, disposed on the substrate, wherein the semiconductor layer overlaps with the gate electrode;
    a gate dielectric layer, disposed between the gate electrode and the semiconductor layer, wherein a vertical projection scope of the gate dielectric layer on the substrate is substantially a same as a vertical projection scope of the semiconductor layer on the substrate;
    a first dielectric layer, disposed on the substrate, wherein the first dielectric layer covers two sides of the gate electrode or the semiconductor layer and is in contact with two sides of the gate dielectric layer or two sides of the semiconductor layer, a dielectric constant of the first dielectric layer is less than a dielectric constant of the gate dielectric layer, and the dielectric constant of the first dielectric layer is less than 4 and greater than 0; and a source electrode and a drain electrode, disposed on the substrate, wherein the source electrode is separated from the drain electrode, and the source electrode and the drain electrode separately contact the semiconductor layer.

2. The thin film transistor according to claim 1, wherein the semiconductor layer is disposed on the source electrode, the drain electrode, and the gate dielectric layer.

3. The thin film transistor according to claim 1, wherein the gate electrode is disposed on the semiconductor layer, and the semiconductor layer is disposed on the source electrode and the drain electrode.

4. The thin film transistor according to claim 1, wherein the thin film transistor further comprises an insulation layer disposed on the first dielectric layer, the gate electrode is disposed on the semiconductor layer, and the source electrode and the drain electrode respectively penetrate through the gate dielectric layer and the insulation layer.

5. The thin film transistor according to claim 1, wherein the gate dielectric layer comprises at least one material of aluminum oxide, silicon oxide, or silicon nitride.

6. The thin film transistor according to claim 1, wherein the first dielectric layer comprises at least one material of polyimide, poly (4-vinyl phenyl), poly (vinyl alcohol), poly (methyl methacrylate), polypropylene, a silsesquioxane polymer, a ferroelectric polymer, or benzocyclobutene.

7. A photoelectric device, comprising:
the thin film transistor according to claim 1;
a protective layer, covering the thin film transistor and the first dielectric layer; and
an optical element, disposed on the substrate, wherein the optical element comprises a first electrode, a second electrode, and an optical layer, the optical layer is located between the first electrode and the second electrode, and one of the first electrode or the second electrode is electrically connected to the drain.

8. The photoelectric device according to claim 7, wherein the optical layer comprises at least one of a self-illumination layer, a non-self-illumination layer, a sensing layer, or an optical sensing layer.

9. The photoelectric device according to claim 7, wherein one of the first electrode or the second electrode which is electrically connected to the drain electrode is used as a pixel electrode, and a vertical projection of the pixel electrode on the substrate at least partially overlaps with a vertical projection of the first dielectric layer on the substrate.

10. The thin film transistor according to claim 1, wherein the semiconductor layer is disposed below the gate electrode.

11. The thin film transistor according to claim 10, wherein the first dielectric layer covers at least one part of sides of the gate electrode and sides of the gate dielectric layer.

12. The thin film transistor according to claim 10, wherein the thin film transistor further comprises an etch stop layer, disposed on the semiconductor layer.

13. The thin film transistor according to claim 12, wherein the etch stop layer further comprises a first contact hole and a second contact hole, and the source electrode and the drain electrode contact the semiconductor layer through the first contact hole and the second contact hole, respectively.

14. The thin film transistor according to claim 13, wherein the first dielectric layer and the etch stop layer are formed of a same layer.

* * * * *